United States Patent
Tahara et al.

[11] Patent Number: 5,541,369
[45] Date of Patent: Jul. 30, 1996

[54] PRINTED CIRCUIT BOARD HAVING TRANSMISSION LINES WITH VARYING THICKNESSES

[75] Inventors: Hiroshi Tahara; Seiju Kobayashi; Hitoshi Ohta, all of Osaka, Japan

[73] Assignee: Nitto Denko Corporation, Osaka, Japan

[21] Appl. No.: 464,567

[22] Filed: Jun. 5, 1995

Related U.S. Application Data

[63] Continuation of Ser. No. 59,278, May 11, 1993.

[30] Foreign Application Priority Data

May 20, 1992 [JP] Japan ................................. 4-127383

[51] Int. Cl.$^6$ .................................................. H05K 1/11
[52] U.S. Cl. .................................. 174/268; 174/117 FF; 361/779
[58] Field of Search .................... 174/117 FF, 117 F, 174/268, 250, 261; 361/748, 774, 777

[56] References Cited

U.S. PATENT DOCUMENTS

| | | |
|---|---|---|
| 3,093,805 | 6/1963 | Osifchin et al. ........................ 333/84 |
| 3,900,737 | 8/1975 | Collier et al. . |
| 4,423,467 | 12/1980 | Shaheen ................................... 361/403 |
| 4,445,039 | 4/1984 | Yew . |
| 4,600,907 | 7/1986 | Grellman et al. ....................... 333/246 |
| 4,761,517 | 8/1988 | Massit et al. ............................ 174/36 |
| 4,879,433 | 11/1989 | Gillett et al. ............................ 174/32 |
| 5,156,353 | 10/1992 | Katsumata et al. ...................... 439/62 |

FOREIGN PATENT DOCUMENTS

| | | |
|---|---|---|
| 60-194593 | 10/1985 | Japan . |
| 5621393 | 2/1991 | Japan . |
| 325993 | 2/1991 | Japan . |

Primary Examiner—Laura Thomas
Attorney, Agent, or Firm—Sughrue, Mion, Zinn, Macpeak & Seas

[57] ABSTRACT

A printed circuit board having juxtaposed thereon in parallel plural conductive paths, at least a part of which has a different length, extending from one end side to the other end side, wherein the electric resistances of the conductive paths are made substantially same by changing the width of at least a part of the conductive paths.

14 Claims, 5 Drawing Sheets

(3-2)

4  3  3  4  3  3  4

PRINTED CIRCUIT BOARD HAVING TRANSMISSION LINES WITH VARYING THICKNESSES

This is a continuation of application Ser. No. 08/059,278 filed May 11, 1993.

FIELD OF THE INVENTION

The present invention relates to a printed circuit boards having plural electrically conductive paths at least a part of which has a different length, wherein an electric resistance of each of the conductive paths is made substantially same.

BACKGROUND OF THE INVENTION

In general, a printed circuit board is mainly used for simply electrically connecting a certain functional portion to other functional portion of a device excluding a high-frequency zone to which the characteristic impedance gives an influence. Accordingly, the electric resistance of the conductive paths (circuit patterns) of a printed circuit board has been scarcely taken into consideration of this type.

In the printed circuit board of this type, the conductive paths are formed by juxtaposing plural circuit patterns each having the same width in parallel with a definite interval between them. Therefore, in a printed circuit board having a circuit of a complicated form, for example, when the conductive paths are juxtaposed in a U-shape, the electric resistance of each conductive path differs inevitably from each other. For example, when the conductive paths are juxtaposed in parallel in a U-shape, the length of the conductive path at the inner side portion of the U-shaped conductive path is different from the length of the conductive path at the outer side portion of the U-shaped conductive paths (the length of the conductive path at the outer side is longer than that of the conductive path at the inner side), whereby the electric resistances of the conductive paths become different from each other. That is, the lengths of the conductive paths in the outer side portion of the U-shaped conductive paths are longer than those of the conductive paths in the inner side portion. Hence the electric resistances of the former are higher than those of the latter.

However, with expansion of the use of printed circuit boards, it has been required to make the electric resistance of each conductive path formed on the printed circuit board same. However, there is actually no practical technique for meeting such a requirement and the development of the technique for meeting the requirement has been keenly desired.

SUMMARY OF THE INVENTION

As a result of various investigations on the practical manner of making the electric resistances of the conductive paths, at least a part of which has a different length, of the printed circuit board substantially same, it has been found that the electric resistances of the conductive paths, at least a part of which has a different length, can be made substantially same by changing the width of at least a part of the conductive paths, for example, when plural conductive paths are juxtaposed in parallel to form a U-shape as a whole, the electric resistances of the conductive paths are made substantially same by widening the widths of the conductive paths having long lengths in the outer side portion of the U-shaped conductive paths and narrowing the widths of the conductive paths successively towards the inner side of the U-shaped conductive paths without changing the whole form, for example, the U-shape of the conductive paths. The present invention has been attained based on this finding.

Accordingly, an object of the present invention is to provide a printed circuit board having plural conductive paths, at least a part of which has a different length, juxtaposed thereon in parallel extending from one end side to the other end side, wherein the electric resistances of the conductive paths are made substantially same by changing the width of at least a part of the conductive paths.

DETAILED DESCRIPTION OF THE INVENTION

The present invention is explained in more detail below.

The electric resistance of a conductive path is shown by following formula (1).

$$R=\Sigma\{(p \times l)/(a \times t)\}+c \qquad (1)$$

R=Electric resistance p=Resistivity of the conductor l=Length of the circuit wire a=Width of the conductor t=Thickness of the conductor c=Factor attributable to processing As is clear from the above formula (1), if the factor (c) attributable to processing is removed, when the resistivity (p) of a conductive path, the length (l) of the conductive path, and the thickness (t) of the conductive path are fixed to definite values, the electric resistance (R) of the conductive path becomes lower as the width (a) of the conductive path increase. Accordingly, by controlling the width (a) of each conductive path in proportion to the length of the conductive path, the electric resistance of each conductive path can be made substantially same. The reason that the width (a) of the conductive path is mainly controlled in the present invention is that the control of the width has a wide application range as compared with the control of the length (l) and the thickness (t) and by widening the width of a conductive path, the electric resistance thus obtained is generally lower than the case of controlling both the length and the width. Thus, the control of the width is advantageous.

By processing as described above, plural conductive paths each halving a substantially same electric resistance are formed on a printed circuit board from one end to the other end. If required and necessary, for controlling the electric resistance of conductive paths during working, the thickness (t) of at least a part of the conductive paths may be changed by removing the surface portion of the conductive path.

The form of the conductive paths formed on the printed circuit board of the present invention is not limited to the U-shape as described above but may be various forms. Also, the present invention can be applied to the case that the electric resistance of a part only in many conductive paths is made substantially same, and the electric resistance of other paths is not made same.

The present invention can be applied to the case that a combination of two or more kinds of printed circuit boards is used, wherein the electric resistance of the conductive paths of a certain printed circuit board is made substantially same as the electric resistance of the conductive paths of other printed circuit board.

Also, the present invention can be applied to the case that the electric resistance of each conductive path is made substantially same by changing the widths of the conductive paths in the central portion excluding the terminal portion in the whole conductive paths.

Figure 7A:
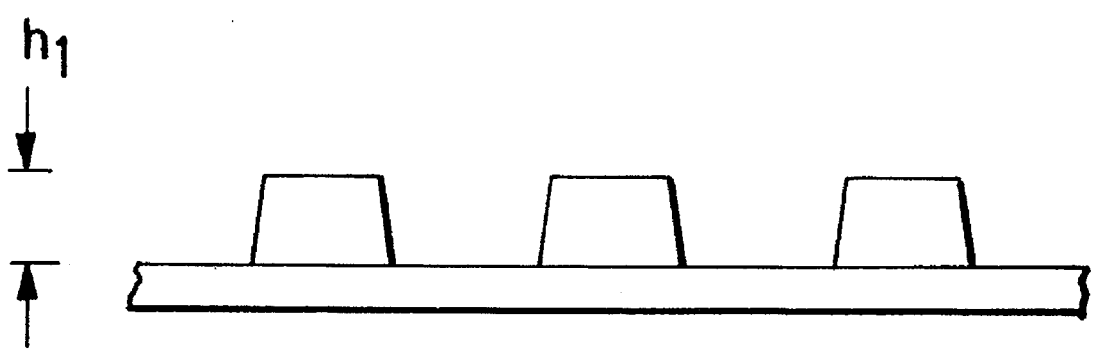
Figure 7B:
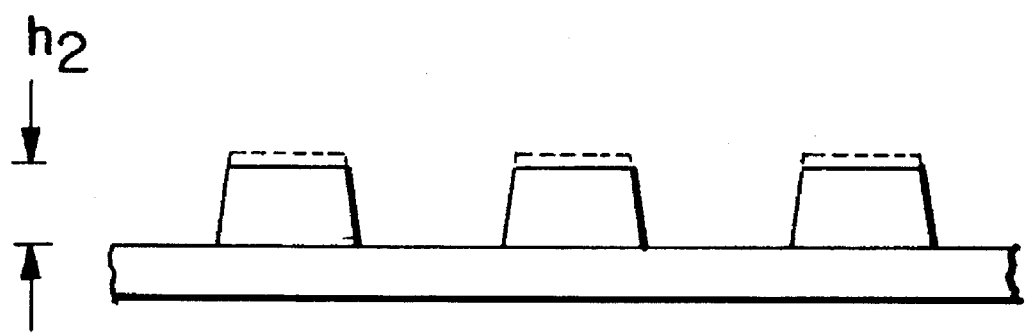
Figure 8A:
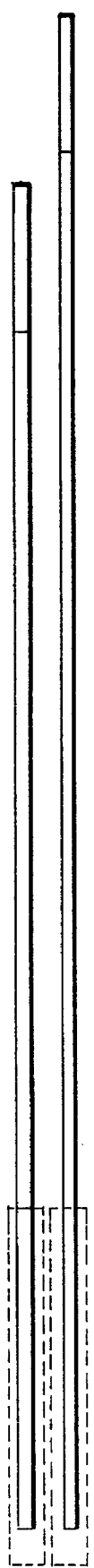
FIGS. 8a and 8b are side and top views, respectively, of a combination of the examples of the invention shown in FIGS. 1 and 5.
Figure 8B:
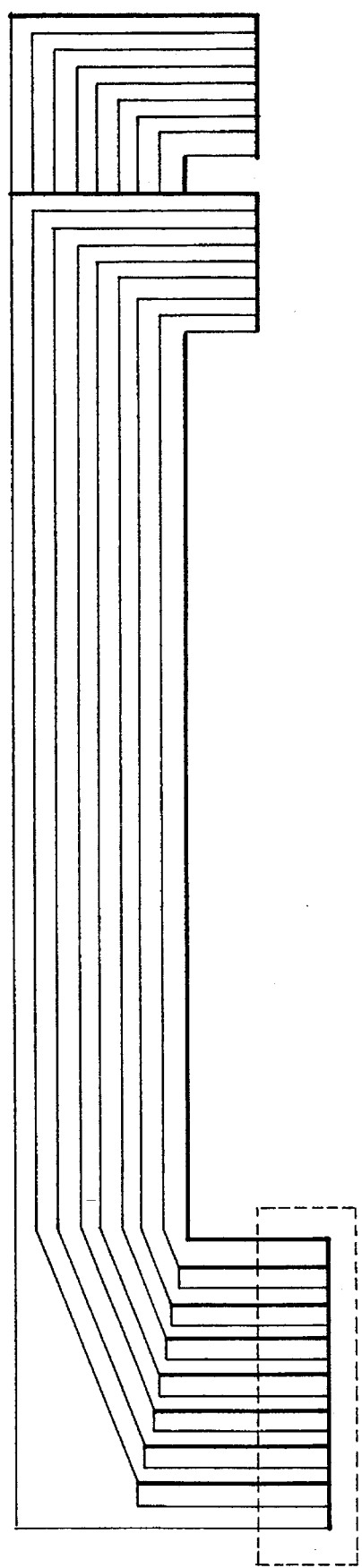

Also, in the present invention the electric resistance of each path can be made substantially the same by varying the thickness of the conductive path together with varying the widths of the conductive paths. Referring to FIGS. 7a and 7b, for example, where three conductive paths are shown on an insulator in accordance with the printed circuit board of the invention, the height of the conductive paths may be varied from $h_1$ to $h_2$, at different locations on the board, the value of $h_1$ being greater than that of $h_2$.

A copper foil is preferably used to form the conductive paths, and a rolled copper foil is more preferably used as the copper foil. Also, an annealed rolled copper foil or a low-temperature annealed rolled copper foil is most preferably used as the rolled copper foil in the point of the effect of the present invention. This is because when an annealed rolled copper foil or a low-temperature annealed rolled copper foil is used, the electric resistance of the printed circuit board obtained is stabilized.

The examples of the present invention are explained by reference to the accompanied drawings together with comparative examples.

EXAMPLE

Figure 1:
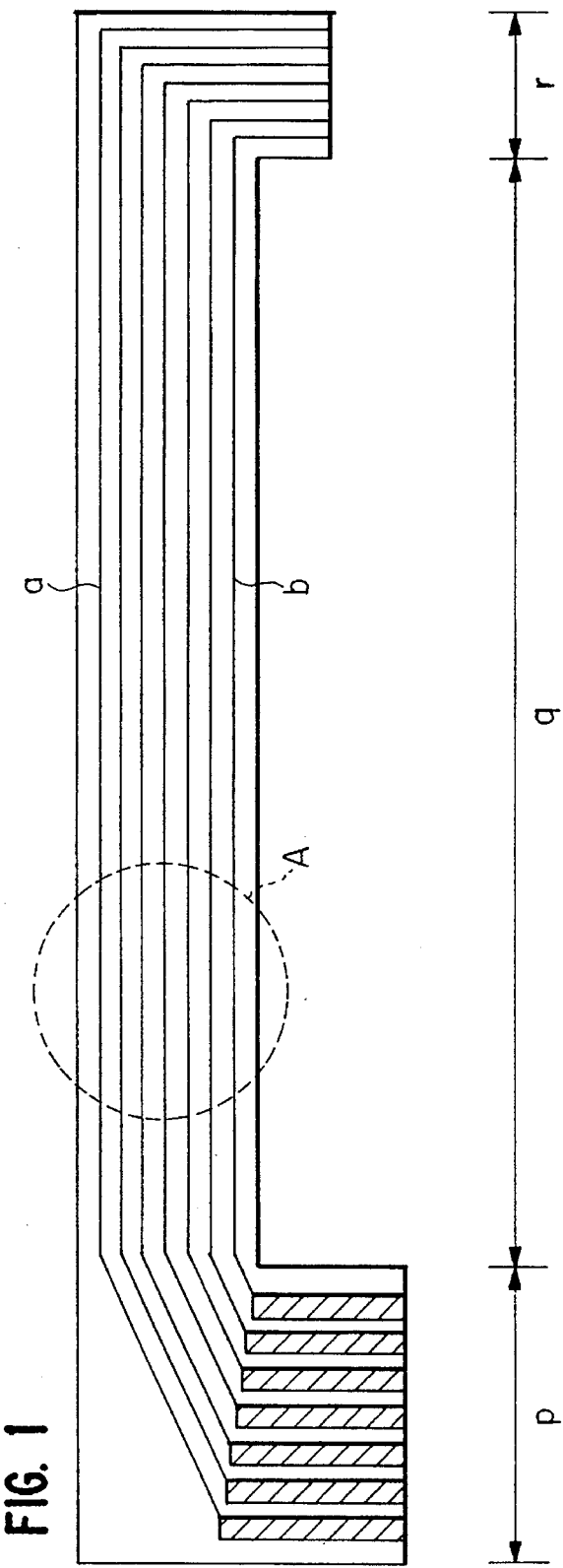
FIG. 1 is a plane view showing an example of the present invention.
Figure 2:
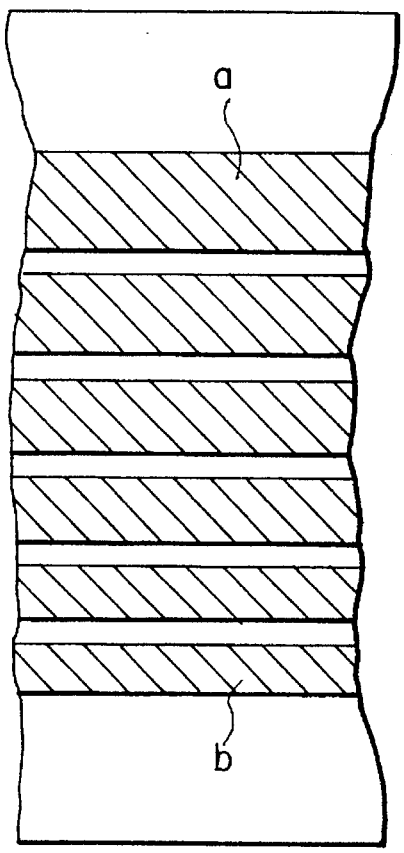
FIG. 2 is a partially enlarged plane view of the portion (A) surrounded by the circle in FIG. 1.

FIG. 1 and FIG. 2 show one example of the present invention.

As shown in FIG. 1, in the printed circuit board (flexible printed circuit board) of this example, 50 conductive paths are formed with an annealed copper foil in parallel in a U-shape between (a) and (b) in FIG. 1 (in FIG. 1, 7 conductive paths are shown for simplification).

As is clear from FIG. 1, in the printed circuit board, the lengths of the conductive paths (circuits) in the upper side portion [(a)-side portion] are long and the lengths of the conductive paths in the lower side portion [(b)-side portion] are short. Accordingly, the widths of the conductive paths in the (a)-side portion are wide and the widths of the conductive paths in the (b)-side portion are narrow, whereby the electric resistances of the conductive paths in the whole portion [portion (p), portion (q) and portion (r)] of the printed circuit board become substantially same.

In addition, the term "substantially same" used in the present invention means that the electric resistance of each conductive path is within 10 or 20% of the average electric resistance between the highest electric resistance and the lowest electric resistance of the conductive path.

In particular, in the printed circuit board shown in FIG. 1, the widths of the conductive paths in the portion (q) only are changed and the widths of the conductive paths in the portions (p) and (r) are not changed. That is, the portion (p) is a connector-inserting portion and since there are regulations on the width, the thickness, etc., of the conductive paths required for the connector-inserting portion, the widths of the conductive paths in the portion (p) cannot be changed. Also, since the portion (r) is a terminal of a contact-type conductive paths each having a narrow wiring area and it is difficult to control the widths, etc., of the conductive paths in the portion (r), the control of the widths of the conductive paths in the portion (r) is avoided. Since the lengths of the conductive paths in the portion (q) connecting the portions (p) and (r) are relatively long and the widths of the conductive paths can be easily controlled, the widths of the conductive paths in the portion (q) are controlled in the present invention.

The control of the widths of the conductive paths can be conducted with a better precision, in the case of producing a photomask by picturing a mask pattern of the photomask on a mask film or plate using a raster scanning method, by picturing linear patterns of the above mask pattern, e.g., the portion corresponding to the portion (q) in FIG. 1 in the present invention with an angle to the scanning direction (width direction).

That is, it can be conducted by contriving the input to a mini-computer equipped to the raster scanning system to picture the linear patterns with an angle to the scanning direction. Also, even when the angle in the case of picturing with the angle to the scanning direction is slight, a sufficient effect is obtained. That is, since the pixel size in the raster scanning method is usually small, a sufficient effect is obtained with a slight angle although the effect differs according to the length of the linear patterns.

Figure 3:
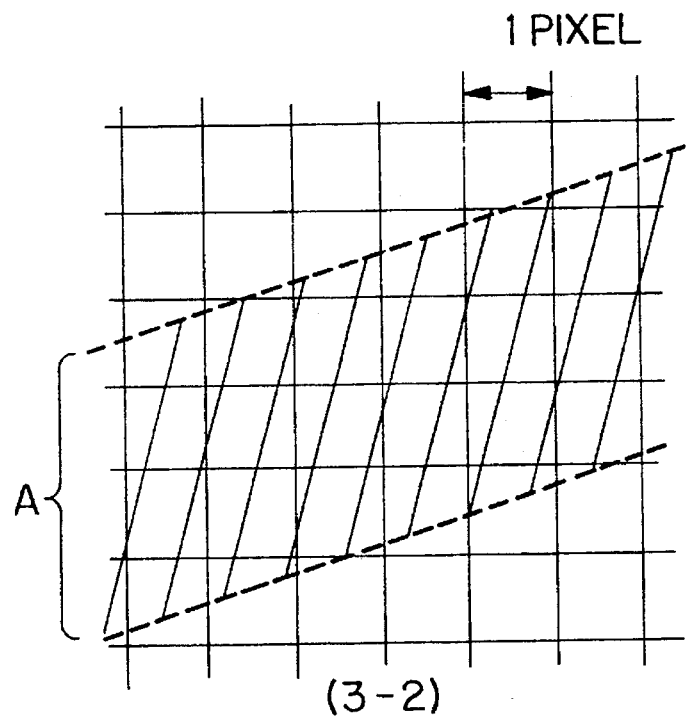
FIG. 3 is a view explaining the formation of the conductive paths in FIG. 1.
Figure 4:
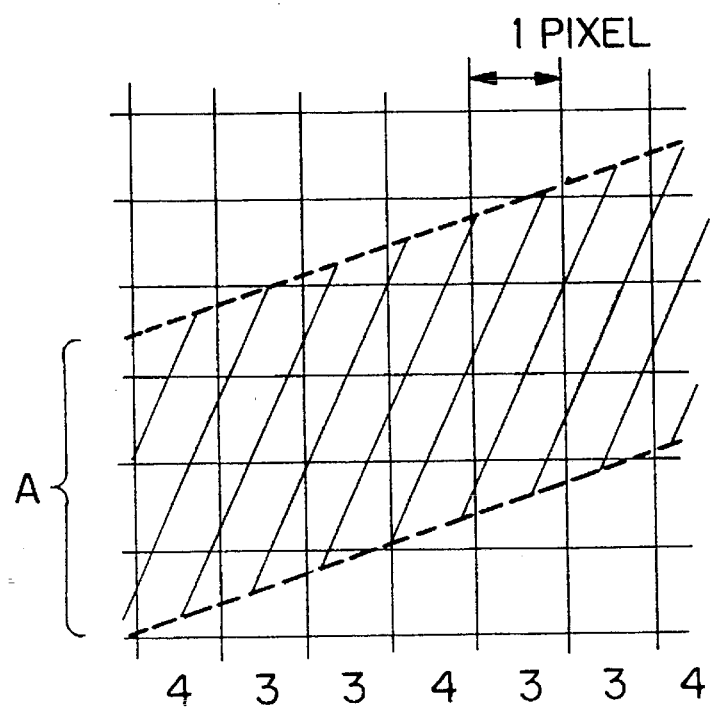
FIG. 4 is also a view explaining the formation of the conductive paths in FIG. 1.

Thus, when a mask pattern is pictured based on the preset values (the width (A) of the conductive path and 3.2 pixels) shown in FIG. 3, the mask pattern (the mixed pattern of 3 pixels and 4 pixels) as shown in FIG. 4 is obtained. As can be seen from the comparison of FIG. 3 and FIG. 4, in the pictured pattern (FIG. 4), slight step-form differences (notches) are formed at the upper portion and the lower portion of the straight line portions but as a whole, the width A' of the pattern in FIG. 4 is almost same as the width A of the predetermined values.

Thus, the width of each conductive path can be controlled to a desired width.

In regard to making the electric resistances of the conductive paths substantially same by changing the widths of the conductive paths, in the 50 conductive paths (circuit patterns) in the printed circuit board shown in FIG. 1, the length of the longest conductive path at the side (a) was 1.7 times longer than the length of the shortest conductive path at the side (b). Thus, by controlling the width of the conductive path at the side (a) to 0.52 mm and the width of the conductive path at the side (b) to 0.23 mm, the electric resistances of the conductive paths could be controlled to substantially the same value. Also,, the width of each of the other conductive paths was controlled by the same method as the above two examples. That is, when the desired present electric resistance of the conductive path was 0.80 Ω, the electric resistances of the whole conductive paths were controlled such that the electric resistances thereof were within 0.841±0.010 Ω0 (mean value±standard deviation). That is, in the printed circuit board shown in FIG. 1, the fluctuation of the electric resistances of the conductive paths could be kept within about 1.2% (standard deviation).

Figure 5:
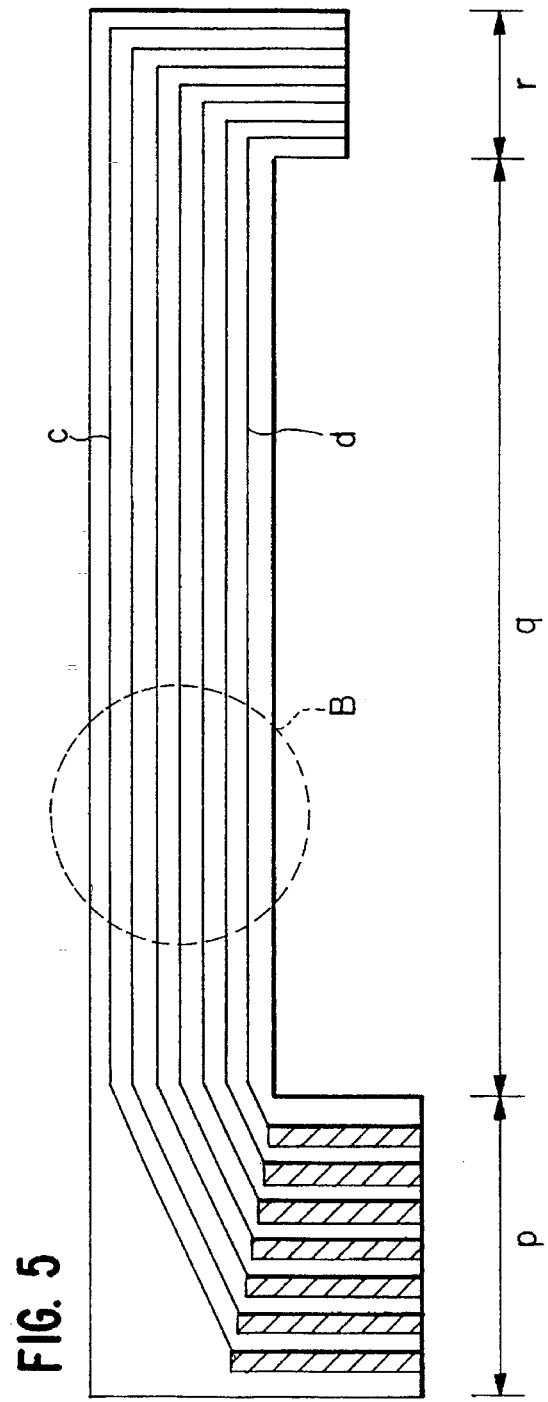
FIG. 5 is a plane view showing another example of the present invention.
Figure 6:
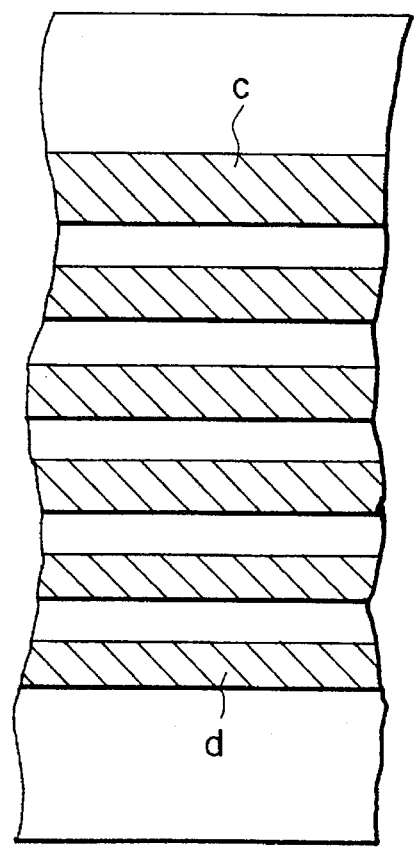
FIG. 6 is a partially enlarged plane view of the portion (B) surrounded by the circle in FIG. 5, FIGS. 7a and 7b are end views of a portion of the example showing and embodiment of the present invention whereby the thickness of the conductive paths are varied, the views being taken at the contact-free end of the example.

FIG. 5 and FIG. 6 show another example of the present invention. Since this example is substantially same as the example shown in FIG. 1 except that the length of the printed circuit board is shorter than that of the example of FIG. 1, the explanation thereof is omitted.

In this example, when the preset electric resistance of each conductive path was 0.80 Ω, the electric resistances of the conductive paths were 0.810±0.010 Ω (mean value±standard deviation) and almost the same result as the conductive paths of the printing circuit board in the above example was obtained.

Also, in the practical use, the printed circuit board shown in FIG. 1 and the printed circuit board shown in FIG. 5 are used as the combination thereof with the former as the upper board and the latter as the lower board and in this case, in the printed circuit board shown in FIG. 1 and the printed circuit board shown in FIG. 5, the total fluctuation of the electric resistance of the conductive paths could be kept within about 5% (standard deviation).

In addition, in the above examples, the width of each conductive path differed but in the present invention, the electric resistances of the whole conductive paths can be controlled to substantially the same value by changing the widths of the conductive paths in plural conductive paths as a unit in a manner such that in the 50 conductive paths, the widths of two or more conductive paths are changed to a same width as one group, then, the widths of two or more conductive paths disposed under the above group of the conductive paths are changed to a same width as one group, furthermore, the widths of two or more conductive paths disposed under the above group of the conductive paths are changed to a same value, and so on.

That is, when the number of the conductive paths is as large as 50 as described above, even if the width of each conductive path is changed little by little, it sometimes happens that they cannot be changed desirably due to the dispersion, etc., in the production step. Therefore, in such a case, it is advantageous to control the electric resistances by changing the widths of the conductive paths as a group unit with two or more conductive paths as one group.

Also, in the above examples, the widths of the conductive paths in the straight line portion only are changed but the electric resistances of the conductive paths may be made substantially same by changing the widths of the whole conductive paths.

Furthermore, in the above examples, flexible printed circuit boards are used but the present invention is not limited to a flexible printed circuit boards and can be applied to a rigid printed circuit board.

The printed circuit board of the present invention, wherein the electric resistances of the conductive paths are made substantially same, can be used for, for example, cables for transmitting electric signals. That is, when electric signal of a same intensity is applied to each of the terminals at one end side of the plural electric paths, the electric signals transmitted to the terminals at the other end become same as the electric signals applied, whereby the dispersion of the intensity of the transmitted signal of each conductive path is small.

Also, other use of the printed circuit board of the present invention is use in controlling the electric current passing through the conductive paths in the case of applying a definite voltage to both terminals at the left and right sides. By controlling the electric current, the electric power consumed can be controlled. Also, according to the form of the circuit, the printed circuit board of the present invention can be used for controlling an exothermic temperature, electromagnetic induction, etc.

As described above, the printed circuit board of the present invention is a printed circuit board having plural conductive paths, at least a part of which has a different length, juxtaposed thereon extending from one end to the other end, wherein the electric resistances of the conductive paths are made substantially same by changing the width of at least a part of the conductive paths. Thus, the printed circuit board of the present invention can be applied to a new use of requiring that the electric resistances of the conductive paths at both terminal of the left and the right sides are substantially same.

While the invention has been described in detail and with reference to specific embodiments thereof, it will be apparent to one skilled in the art that various changes and modifications can be made therein without departing from the spirits and scope thereof.

What is claimed is:

1. A printed circuit board, comprising juxtaposed parallel plural conductive paths, at least a part of said paths having different lengths, said paths extending from one end side of said board to another side of said board, wherein said conductive paths have varying thickness.

2. The printed circuit board of claim 1, wherein said conductive paths have an intermediate long straight line portion between said one end side and said another side of said board and said conductive paths have said varying widths in said intermediate portion.

3. The printed circuit board of claim 1, wherein said printed circuit board comprises a combination of more than one kind of printed circuit board, and the electric resistance of the conductive paths of each of said printed circuit board is made substantially the same.

4. The printed circuit board of claim, wherein said conductive paths are formed with a copper foil.

5. The printed circuit board of claim 4, wherein said copper foil is a rolled copper foil.

6. The printed circuit board of claim 5, wherein said rolled copper foil is selected from the group consisting of an annealed roller copper foil and a low-temperature annealed rolled copper foil.

7. The printed circuit board of claim 1, wherein the electric resistances of the whole conductive paths are controlled to substantially the same by changing the widths of the conductive paths in plural conductive paths as every unit.

8. A cable for transmitting electric signals, comprising a printed circuit board, said printed circuit board comprising juxtaposed parallel plural conductive paths, at least a part of said paths having different lengths, said paths extending from one end side of said board to another side of said board, wherein said conductive paths have varying thickness.

9. The cable of claim 8, wherein said conductive paths have an intermediate long straight line portion between said one end side and said another side of said board and said conductive paths have said varying widths in said intermediate portion.

10. The cable of claim 8, wherein said printed circuit board comprises a combination of more than one kind of printed circuit board, and the electric resistance of the conductive paths of each of said printed circuit board is made substantially the same.

11. The cable of 8, wherein said conductive paths are formed with a copper foil.

12. The cable of claim 11, wherein said copper foil is a rolled copper foil.

13. The cable of claim 12, wherein said roller copper foil is selected from the group consisting of an annealed rolled copper foil and a low-temperature annealed rolled copper foil.

14. In a cable for transmitting electric signals, the improvement comprising the use of a printed circuit board comprising juxtaposed parallel plural conductive paths, at least a part of said paths having different lengths, said paths extending from one end side of said board to another side of said board, wherein said conductive paths have varying thickness.

* * * * *